(12) United States Patent
Pachamuthu et al.

(10) Patent No.: US 11,573,731 B2
(45) Date of Patent: Feb. 7, 2023

(54) MEMORY CONTROLLER FOR RESOLVING STRING TO STRING SHORTS

(71) Applicant: Western Digital Technologies, Inc., San Jose, CA (US)

(72) Inventors: Jayavel Pachamuthu, San Jose, CA (US); Rajan Paudel, Dublin, CA (US); Deepak Bharadwaj, Fremont, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/873,882

(22) Filed: Jul. 26, 2022

(65) Prior Publication Data
US 2022/0357874 A1 Nov. 10, 2022

Related U.S. Application Data

(63) Continuation of application No. 16/898,098, filed on Jun. 10, 2020, now Pat. No. 11,422,736.

(51) Int. Cl.
*G11C 16/04* (2006.01)
*G06F 3/06* (2006.01)
*G11C 16/10* (2006.01)

(52) U.S. Cl.
CPC .......... *G06F 3/0655* (2013.01); *G06F 3/0604* (2013.01); *G06F 3/0679* (2013.01); *G11C 16/0483* (2013.01); *G11C 16/10* (2013.01); *G11C 16/0466* (2013.01)

(58) Field of Classification Search
USPC ................................. 365/184, 185.09, 185.11
See application file for complete search history.

(56) References Cited

U.S. PATENT DOCUMENTS

2002/0145907 A1* 10/2002 Byeon .................... G11C 29/02
365/185.11
2018/0052732 A1* 2/2018 Jo ........................ G06F 11/1048

* cited by examiner

*Primary Examiner* — Jason Lappas
(74) *Attorney, Agent, or Firm* — Michael Best & Friedrich LLP

(57) ABSTRACT

A memory controller includes, in one embodiment, a memory interface and a controller circuit. The memory interface is configured to interface with a memory interface configured to interface with a memory having a plurality of memory blocks. Each memory block has a plurality of strings. The controller circuit is configured to perform a string defect leakage check on one of the memory blocks during a first programming operation of the one memory block, determine whether the one memory block has one or more string to string shorts based on the string defect leakage check, and resolve the string to string shorts in response to determining that the one of the memory blocks has the string to string shorts.

20 Claims, 4 Drawing Sheets

| | String 0 | String 1 | String 2 | String 3 | String 4 |
|---|---|---|---|---|---|
| | H | L | H | L | H |
| | L | H | L | H | L |

FIG. 4

| String 0-1 | String 1-2 | String 2-3 | String 3-4 |
|---|---|---|---|
| H | L | L | L |
| L | H | L | L |
| L | L | H | L |
| L | L | L | H |

FIG. 3

| Problematic String | Bit-0 | Bit-1 | Bit-2 |
|---|---|---|---|
| Good | 0 | 0 | 0 |
| S0→S1 | 1 | 0 | 0 |
| S1→S2 | 0 | 1 | 0 |
| S2→S3 | 1 | 1 | 0 |
| S3→S4 | 0 | 0 | 1 |

FIG. 5

MEMORY CONTROLLER FOR RESOLVING STRING TO STRING SHORTS

CROSS-REFERENCE TO RELATED APPLICATION

This application is a continuation of U.S. Non-Provisional patent application Ser. No. 16/898,098, filed on Jun. 10, 2020, the entire contents of which is incorporated herein by reference.

BACKGROUND

This application relates generally to memory devices and, more particularly, to a controller in a memory device that resolves string to string shorts.

In certain memory architectures, large block size leads to select gate drain (SGD) to slit half etch (SHE) shorts that may impact string operations. The SGD to SHE shorts may be due to process related issues or lithographic issues in manufacturing three-dimensional memory architectures (e.g., a Bit Cost Scalable (BiCS) architecture or other three-dimensional memory architecture).

SUMMARY

The present disclosure includes devices, methods, and apparatuses that resolve the SGD to SHE shorts (referred to herein as "string to string shorts"). In some examples, the devices, methods, and apparatuses of the present disclosure also recover memory blocks from the impact of the string to string shorts. For example, the devices, methods, and apparatuses of the present disclosure may still partially use the memory blocks that are impacted by the string to string shorts.

The disclosure provides a memory controller including, in one embodiment, a memory interface and a controller circuit. The memory interface is configured to interface with a memory having a plurality of memory blocks. Each memory block having a plurality of strings. The controller circuit is configured to perform a string defect leakage check on one memory block of the plurality of memory blocks during a first programming operation of the one memory block, determine whether the one memory block has one or more string to string shorts based on the string defect leakage check, and resolve the one or more string to string shorts in response to determining that the one memory block has the one or more string to string shorts.

The disclosure also provides a method. In one embodiment, the method includes performing, with a controller circuit, a string defect leakage check on one memory block of a memory during a first programming operation of the one memory block. The method includes determining, with the controller circuit, whether the one memory block has one or more string to string shorts based on the string defect leakage check. The method also includes resolving, with the controller circuit, the one or more string to string shorts in response to determining that the one memory block has the one or more string to string shorts.

The disclosure also provides an apparatus including, in one embodiment, means for performing a string defect leakage check on one memory block during a first programming operation of the one memory block, means for determining whether the one memory block has one or more string to string shorts based on the string defect leakage check, and means for resolving the one or more string to string shorts in response to determining that the one memory block has the one or more string to string shorts.

In this manner, various aspects of the disclosure provide for improvements in at least the technical fields of memory devices and their design and architecture. The disclosure can be embodied in various forms, including hardware or circuits controlled by computer-implemented methods, computer program products, computer systems and networks, user interfaces, and application programming interfaces; as well as hardware-implemented methods, signal processing circuits, memory arrays, application specific integrated circuits, field programmable gate arrays, and the like. The foregoing summary is intended solely to give a general idea of various aspects of the disclosure, and does not limit the scope of the disclosure in any way.

BRIEF DESCRIPTION OF THE DRAWINGS

FIG. 3 is a table illustrating a first example string defect leakage check to detect shorts between pairs of neighboring strings, in accordance with some embodiments of the disclosure.

FIG. 4 is a table illustrating a second example string defect leakage check to detect shorts between pairs of neighboring strings, in accordance with some embodiments of the disclosure.

FIG. 5 is a table illustrating example bit registers that registers shorts between pairs of neighboring strings, in accordance with some embodiments of the disclosure.

DETAILED DESCRIPTION

In the following description, numerous details are set forth, such as data storage device configurations, controller operations, and the like, in order to provide an understanding of one or more aspects of the present disclosure. It will be readily apparent to one skilled in the art that these specific details are merely exemplary and not intended to limit the scope of this application. In particular, the functions associated with the memory device may be performed by hardware (e.g., analog or digital circuits), a combination of hardware and software (e.g., program code or firmware stored in a non-transitory computer-readable medium that is executed by processing or control circuitry), or any other suitable means. The following description is intended solely to give a general idea of various aspects of the disclosure, and does not limit the scope of the disclosure in any way.

Figure 1:
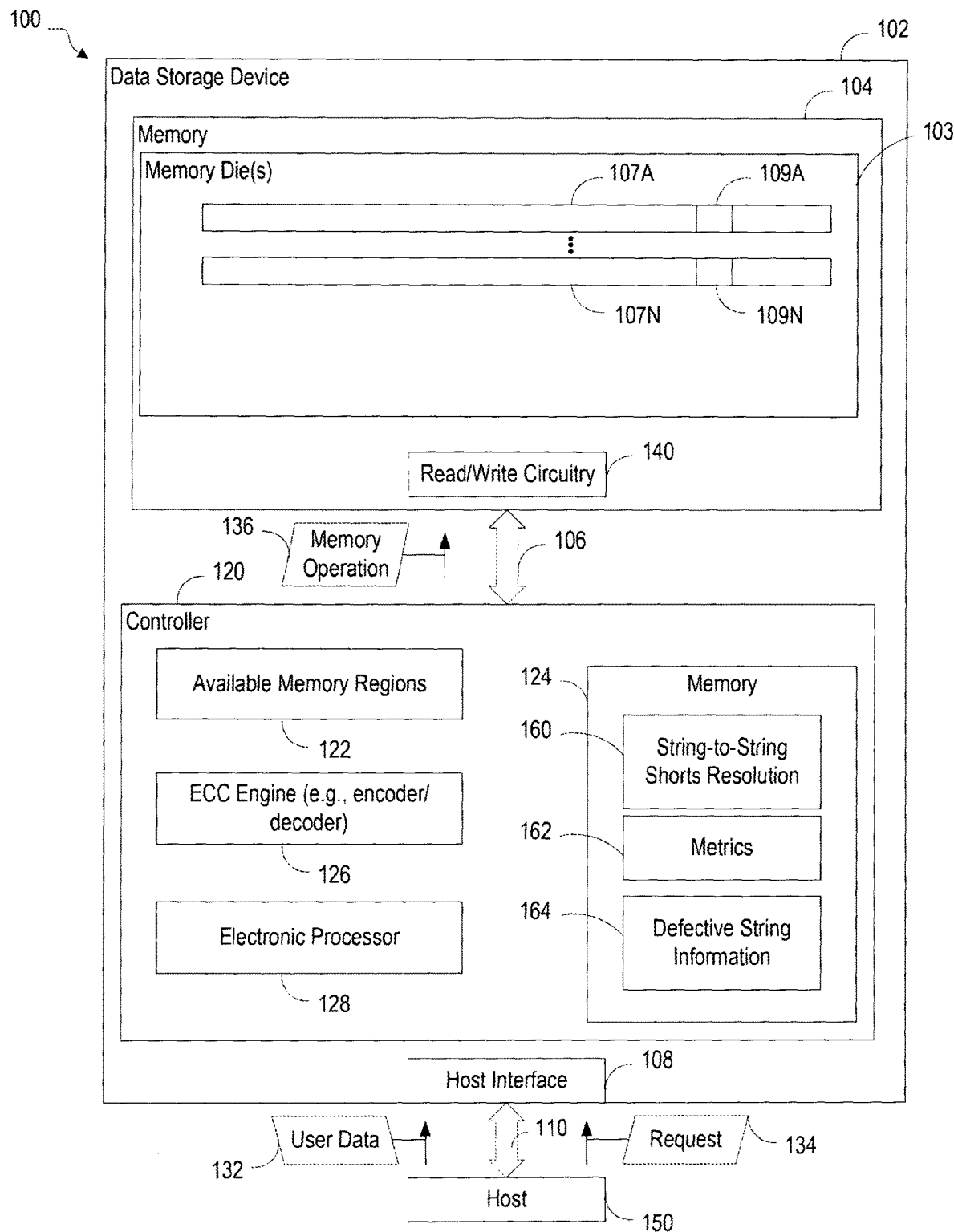
FIG. 1 is a block diagram of a system including a data storage device that has a memory controller that resolves string to string shorts, in accordance with some embodiments of the disclosure.

FIG. 1 is block diagram of a system including a data storage device that has a memory controller that resolves string to string shorts, in accordance with some embodiments of the disclosure. In the example of FIG. 1, the system 100 includes a data storage device 102 and a host device 150. The data storage device 102 includes a controller 120 and a memory 104 (e.g., non-volatile memory) that is coupled to the controller 120.

The data storage device 102 and the host device 150 may be operationally coupled via a connection (e.g., a communication path 110), such as a bus or a wireless connection. In some examples, the data storage device 102 may be embedded within the host device 150. Alternatively, in other examples, the data storage device 102 may be removable from the host device 150 (i.e., "removably" coupled to the host device 150). As an example, the data storage device 102 may be removably coupled to the host device 150 in accordance with a removable universal serial bus (USB) configuration. In some implementations, the data storage device 102 may include or correspond to a solid state drive (SSD), which may be used as an embedded storage drive (e.g., a mobile embedded storage drive), an enterprise storage drive (ESD), a client storage device, or a cloud storage drive, or other suitable storage drives.

The data storage device 102 may be configured to be coupled to the host device 150 via the communication path 110, such as a wired communication path and/or a wireless communication path. For example, the data storage device 102 may include an interface 108 (e.g., a host interface) that enables communication via the communication path 110 between the data storage device 102 and the host device 150, such as when the interface 108 is communicatively coupled to the host device 150.

The host device 150 may include an electronic processor and a memory. The memory may be configured to store data and/or instructions that may be executable by the electronic processor. The memory may be a single memory or may include one or more memories, such as one or more non-volatile memories, one or more volatile memories, or a combination thereof. The host device 150 may issue one or more commands to the data storage device 102, such as one or more requests to erase data at, read data from, or write data to the memory 104 of the data storage device 102. For example, the host device 150 may be configured to provide data, such as user data 132, to be stored at the memory 104 or to request data to be read from the memory 104. The host device 150 may include a mobile smartphone, a music player, a video player, a gaming console, an electronic book reader, a personal digital assistant (PDA), a computer, such as a laptop computer or notebook computer, any combination thereof, or other suitable electronic device.

The host device 150 communicates via a memory interface that enables reading from the memory 104 and writing to the memory 104. In some examples, the host device 150 may operate in compliance with an industry specification, such as a Universal Flash Storage (UFS) Host Controller Interface specification. In other examples, the host device 150 may operate in compliance with one or more other specifications, such as a Secure Digital (SD) Host Controller specification or other suitable industry specification. The host device 150 may also communicate with the memory 104 in accordance with any other suitable communication protocol.

The memory 104 of the data storage device 102 may include a non-volatile memory (e.g., NAND, BiCS family of memories, or other suitable memory). In some examples, the memory 104 may be any type of flash memory. For example, the memory 104 may be two-dimensional (2D) memory or three-dimensional (3D) flash memory. The memory 104 may include one or more memory dies 103. Each of the one or more memory dies 103 may include one or more blocks (also referred to herein as "one or more memory blocks" or in the singular as "a memory block"). Each block may include one or more groups of storage elements, such as a representative group of storage elements 107A-107N. The group of storage elements 107A-107N may be configured as a word line. The group of storage elements 107A-107N may include multiple storage elements (e.g., memory cells that are referred to herein as a "string"), such as a representative storage elements 109A and 109N, respectively.

The memory 104 may include support circuitry, such as read/write circuitry 140, to support operation of the one or more memory dies 103. Although depicted as a single component, the read/write circuitry 140 may be divided into separate components of the memory 104, such as read circuitry and write circuitry. The read/write circuitry 140 may be external to the one or more memory dies 103 of the memory 104. Alternatively, one or more individual memory dies may include corresponding read/write circuitry that is operable to read from and/or write to storage elements within the individual memory die independent of any other read and/or write operations at any of the other memory dies.

The data storage device 102 includes the controller 120 coupled to the memory 104 (e.g., the one or more memory dies 103) via a bus 106, an interface (e.g., interface circuitry), another structure, or a combination thereof. For example, the bus 106 may include multiple distinct channels to enable the controller 120 to communicate with each of the one or more memory dies 103 in parallel with, and independently of, communication with the other memory dies 103. In some implementations, the memory 104 may be a flash memory.

The controller 120 is configured to receive data and instructions from the host device 150 and to send data to the host device 150. For example, the controller 120 may send data to the host device 150 via the interface 108, and the controller 120 may receive data from the host device 150 via the interface 108. The controller 120 is configured to send data and commands to the memory 104 and to receive data from the memory 104. For example, the controller 120 is configured to send data and a write command to cause the memory 104 to store data to a specified address of the memory 104. The write command may specify a physical address of a portion of the memory 104 (e.g., a physical address of a word line of the memory 104) that is to store the data.

The controller 120 is configured to send a read command to the memory 104 to access data from a specified address of the memory 104. The read command may specify the physical address of a region of the memory 104 (e.g., a physical address of a word line of the memory 104). The controller 120 may also be configured to send data and commands to the memory 104 associated with background scanning operations, garbage collection operations, and/or wear-leveling operations, or other suitable memory operations. For example, the controller 120 is configured to send data and commands to the memory 104 according to the examples processes as described in FIGS. 6 and 7.

The controller 120 may include available memory regions 122, a memory 124, an error correction code (ECC) engine 126, and an electronic processor 128. The available memory regions 122 may indicate a pool of free regions of the memory 104, such as one or more regions available to store data as part of a write operation. For example, the available memory regions 122 may be organized as a table or other data structure that is configured to track free regions of the memory 104 that are available for write operations.

One example of the structural and functional features provided by the controller 120 are illustrated in FIG. 1. However, the controller 120 is not limited to the structural and functional features provided by the controller 120 in FIG. 1. The controller 120 may include fewer or additional structural and functional features that are not illustrated in FIG. 1.

The memory 124 may be configured to store data and/or instructions that may be executable by the electronic processor 128. The memory 124 may include string to string resolution program data 160, metrics 162, and defective string information 164. In some examples, the defective string information 164 may be a lookup table of all the storage elements 109 of the memory 104. In these examples, the storage elements 109 in the lookup table may be tracked on a block-by-block basis with the bit registers described in FIG. 5. However, the lookup table is not limited to a block-by-block basis. Instead, the storage elements 109 in the lookup table may also be tracked on a storage element-by-storage element basis, on a wordline-by-wordline basis, on a die-by-die basis, or other suitable basis.

The string to string resolution program data 160 may be instructions that are executable by the electronic processor 128. The string to string resolution program data 160 is described in greater detail below with respect to FIGS. 6 and 7.

The metrics 162 may be tracked on a storage element-by-storage element basis, on a wordline-by-wordline basis, on a block-by-block basis, on a die-by-die basis, or other suitable basis. The one or more metrics 162 may track a program/erase (P/E) count (PEC), a bit error rate (BER), a programming time, an erase time, a number of voltage pulses to program a storage element, a number of voltage pulses to erase a storage element, a combination thereof, or other suitable metrics corresponding to the memory 104. In some examples, the metrics 162 may also include the defective string information 164.

Figure 2:
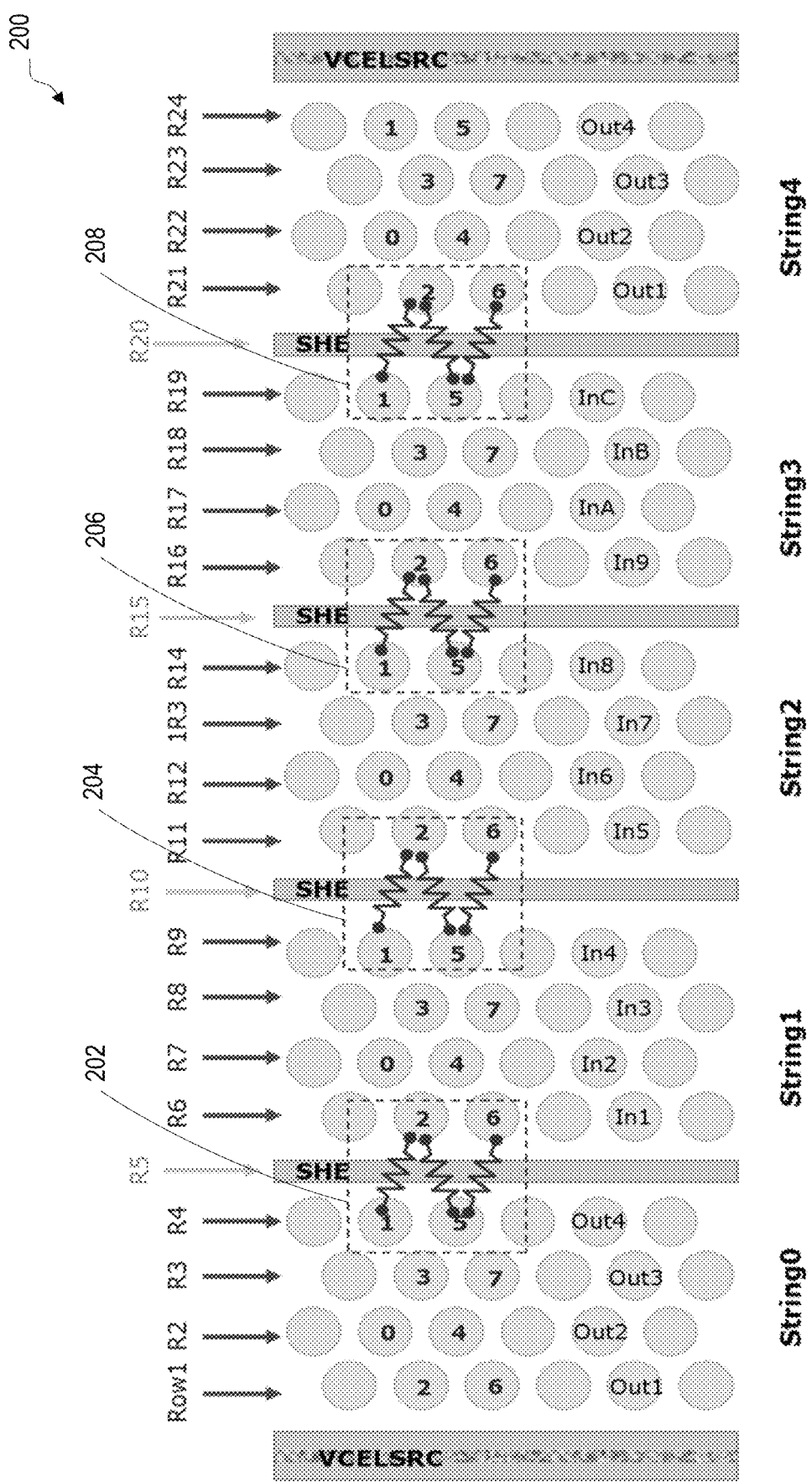
FIG. 2 is a diagram illustrating string to string shorts in a three-dimensional NAND memory device.

FIG. 2 is diagram illustrating string to string shorts in a three-dimensional NAND memory device architecture. In the example of FIG. 2, the three-dimensional NAND memory device architecture is an example BiCS architecture 200. The example BiCS architecture 200 includes a plurality of string to string shorts 202-208 across respective slit half etches (SHEs).

However, the three-dimensional NAND memory device architecture of FIG. 2 is not limited to the example BiCS architecture 200. The three-dimensional NAND memory device architecture of FIG. 2 may be any suitable three-dimensional NAND memory device architecture, and the example BiCS architecture 200 is used for ease of understanding.

In the example of FIG. 2, the BiCS architecture 200 has twenty staggered memory holes (twenty-four physical memory holes) divided into five strings, i.e., String0, String1, String2, String3, and String4 that are between two source lines, VCELSRC. In this example, the memory holes associated with String0 and String4 are "outer" memory holes and the memory holes associated with String1-String3 are "inner" memory holes.

In other embodiments, more or less than twenty staggered memory holes (more or less than twenty-four physical memory holes) may be formed. The memory holes may be divided into more or less than five strings. Specifically, memory holes may be divided at least into two or more strings. In some examples, the BiCS architecture 200 may also have a block size of thirty-four megabytes, and due to this block size, the plurality of string to string shorts 202-208 is an issue that impacts string operations in the BiCS architecture 200. In other embodiments, a three-dimensional NAND memory array may have a block size of more or less than thirty-four megabytes, and due to this block size, the plurality of string to string shorts 202-208 is an issue that impacts string operations in the BiCS architecture 200.

A first string to string short 202 is between String0 and String1 and across the slit half etch (SHE) at row 5. In the example of FIG. 2, the first string to string short 202 is a short between a first memory hole MH1 of the String0, a second memory hole MH2 of the String1, a third memory hole MH5 of the String0, and a fourth memory hole MH6 of the String1.

A second string to string short 204 is between String1 and String2 and across the SHE at row 10. In the example of FIG. 2, the second string to string short 204 is a short between a first memory hole MH1 of the String1, a second memory hole MH2 of the String2, a third memory hole MH5 of the String1, and a fourth memory hole MH6 of the String2.

A third string to string short 206 is between String2 and String3 and across the SHE at row 15. In the example of FIG. 2, the third string to string short 206 is a short between a first memory hole MH1 of the String2, a second memory hole MH2 of the String3, a third memory hole MH5 of the String2, and a fourth memory hole MH6 of the String3.

A fourth string to string short 208 is between String3 and String4 and across the SHE at row 20. In the example of FIG. 2, the fourth string to string short 208 is a short between a first memory hole MH1 of the String3, a second memory hole MH2 of the String4, a third memory hole MH5 of the String3, and a fourth memory hole MH6 of the String4.

FIG. 3 is a table illustrating a first example string detect leakage check 300 to detect shorts between pairs of neighboring strings, in accordance with some embodiments of the disclosure. FIG. 3 is described with respect to the BiCS architecture 200 of FIG. 2.

In the example of FIG. 3, the first example string detect leakage check 300 includes applying a high bias between String0 and String1 while applying a low bias between String1 and String2, a low bias between String2 and String3, and a low bias between String3 and String4.

The first example string detect leakage check 300 includes applying a high bias between String1 and String2 while applying a low bias between String0 and String1, a low bias between String2 and String3, and a low bias between String3 and String4.

The first example string detect leakage check 300 includes applying a high bias between String2 and String3 while applying a low bias between String0 and String1, a low bias between String1 and String2, and a low bias between String3 and String4.

The first example string detect leakage check 300 also includes applying a high bias between String3 and String4 while applying a low bias between String0 and String1, a low bias between String1 and String2, and a low bias between String2 and String3.

By performing the first example string detect leakage check 300 (i.e., applying a high bias to one neighboring pair of strings at a time while applying a low bias to the other strings), the controller 120 detects a leakage current between different pairs of neighboring strings. For example, the controller 120 detects a leakage current between the different pairs of neighboring strings, i.e., String0 and String1, String1 and String2, String2 and String3, and String3 and String4 of FIG. 2, which indicates the plurality of string to string shorts 202-208 as illustrated in FIG. 2.

FIG. 4 is a table illustrating a second example string defect leakage check 400 to detect shorts between pairs of neighboring strings, in accordance with some embodiments of the disclosure. FIG. 4 is described with respect to the BiCS architecture 200 of FIG. 2.

In the example of FIG. 4, the second example string defect leakage check 400 includes applying a high bias at even strings (e.g., String0, String2, and String4) while applying a low bias at odd strings (e.g., String1 and String3).

In the example of FIG. 4, the second example string defect leakage check 400 also includes applying a high bias at odd strings (e.g., String1 and String3) while applying a low bias at even strings (e.g., String0, String2, and String4).

By performing the second example string defect leakage check 400 (i.e., applying a high bias to even or odd strings while applying a low bias to the other strings), the controller 120 detects a leakage current at the different strings. For example, by performing the second example string defect leakage check 400, the controller 120 detects a leakage current at String1, String2, String3, and String4 of FIG. 2, which indicates the plurality of string to string shorts 202-208 as illustrated in FIG. 2.

The controller 120 may also perform the second example string defect leakage check 400 faster than the first example string detect leakage check 300 because the second example string defect leakage check 400 has less operations than the first example string detect leakage check 300. Thus, the second example string defect leakage check 400 is computationally more efficient than the first example string detect leakage check 300.

FIG. 5 is a table illustrating example bit registers that registers shorts between pairs of neighboring strings, in accordance with some embodiments of the disclosure. FIG. 5 is described with respect to the controller 120 and the defective string information 164 of FIG. 1 and the BiCS architecture 200 of FIG. 2.

As illustrated in FIG. 5, the example 500 includes three bit registers Bit-0, Bit-1, and Bit-2. The controller 120 controls the defective string information 164 to store the same binary number when the string pair does not have any leakage. For example, the controller 120 controls the defective string information 164 to store a zero in bit registers Bit-0, Bit-1, and Bit-2 when the string pair does not have any leakage.

The controller 120 controls the defective string information 164 to store a different binary number in the bit register Bit-0 when the string pair String0 and String1 does have leakage. For example, the controller 120 controls the defective string information 164 to store a one in bit register Bit-0 when the string pair String0 and String1 does have leakage, e.g., the first string to string short 202.

The controller 120 controls the defective string information 164 to store a different binary number in the bit register Bit-1 when the string pair String1 and String2 does have leakage. For example, the controller 120 controls the defective string information 164 to store a one in bit register Bit-1 when the string pair String1 and String2 does have leakage, e.g., the two string to string short 204.

The controller 120 controls the defective string information 164 to store a different binary number in the bit registers Bit-0 and Bit-1 when the string pair String2 and String3 does have leakage. For example, the controller 120 controls the defective string information 164 to store a one in bit registers Bit-0 and Bit-1 when the string pair String2 and String3 does have leakage, e.g., the third string to string short 206.

The controller 120 controls the defective string information 164 to store a different binary number in the bit register Bit-2 when the string pair String3 and String4 does have leakage. For example, the controller 120 controls the defective string information 164 to store a one in bit register Bit-2 when the string pair String3 and String4 does have leakage, e.g., the fourth string to string short 208.

Figure 6:
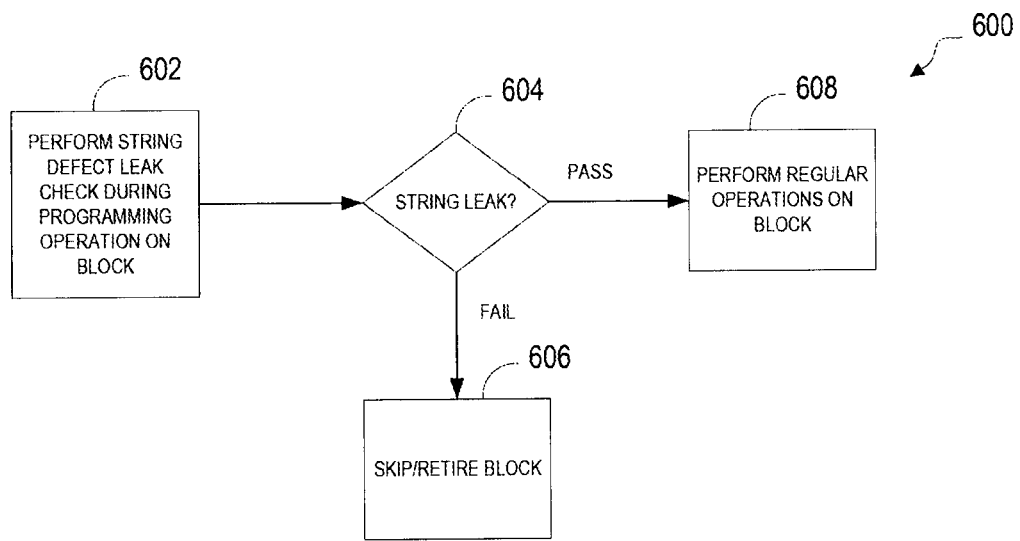
FIG. 6 is a flowchart illustrating a first example for resolving string to string shorts, in accordance with some embodiments of the disclosure.

FIG. 6 is a flowchart illustrating a first example process 600 for resolving string to string shorts, in accordance with some embodiments of the disclosure. FIG. 6 is described with respect to FIGS. 1, 3, and 4 and being performed on a block-by-block basis. However, FIG. 6 is not limited to being performed on a block-by-block basis and may be performed on any other suitable basis (e.g., a page-by page basis).

As illustrated in FIG. 6, the first example process 600 includes performing the string defect leakage check during a first programming operation of the block (at block 602). For example, the controller 120 performs the string defect leakage check (e.g., the first example string defect leakage check 300 or the second example string defect leakage check 400 as described above in FIGS. 3 and 4, respectively) on all of the strings in the block 107A during an erase operation.

The first example process 600 includes determining whether the strings pass or fail based on the string defect leakage check (at decision block 604). For example, the controller 120 determines whether some or all of the strings in the block 107A pass or fail based on the string defect leakage check.

The first example process 600 includes skipping or retiring the block (at block 606) in response to determining that one or more strings of the block fail the string defect leakage check ("Fail" at block decision 604). For example, the controller 120 skips or retires the block 107A in response to determining that one or more strings of the block failed the string defect leakage check. In some examples, the controller 120 may retire the block 107A from the programming operations by removing the block 107A from the available memory regions 122.

The first example process 600 includes performing regular operation on the block (at block 608) in response to determining that all strings of the block do not fail the string defect leakage check ("Pass" at decision block 604). For example, the controller 120 performs regular operations on the block 107A in response to determining that all strings of the block 107A did not fail the string defect leakage check.

Figure 7:
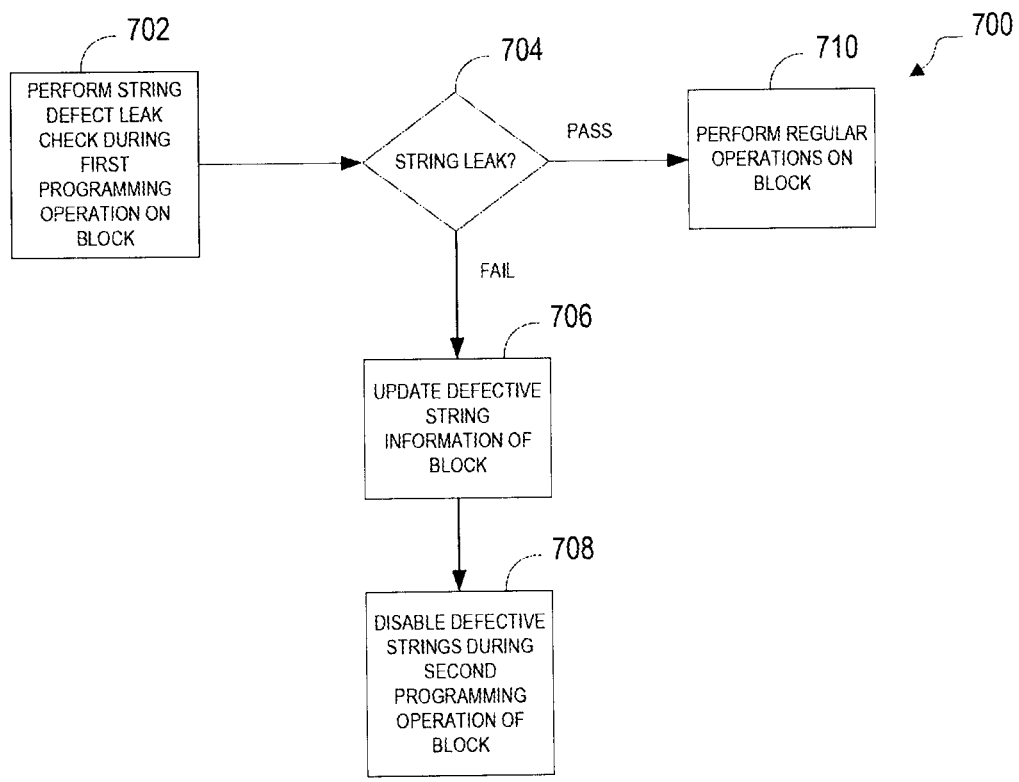
FIG. 7 is a flowchart illustrating a second example for resolving string to string shorts, in accordance with some embodiments of the disclosure.

FIG. 7 is a flowchart illustrating a second example process 700 for resolving string to string shorts, in accordance with some embodiments of the disclosure. FIG. 7 is described with respect to FIGS. 1, 3, and 4 and being performed on a block-by-block basis. However, FIG. 7 is not limited to being performed on a block-by-block basis and may be performed on any other suitable basis (e.g., a page-by page basis).

As illustrated in FIG. 7, the second example process 700 includes performing the string defect leakage check during a first programming operation of a block (at block 702). For example, the controller 120 performs the string defect leakage check (e.g., the first example string defect leakage check 300 or the second example string defect leakage check 400 as described above in FIGS. 3 and 4, respectively) on all of the strings in the block 107A during an erase operation.

The second example process 700 includes determining whether the strings of the block pass or fail based on the string defect leakage check (at decision block 704). For example, the controller 120 determines whether some or all of the strings in the block 107A pass or fail based on the string defect leakage check.

The second example process 700 includes updating defective string information of the block (at block 706) in response to determining that one or more strings of the block fail the string defect leakage check ("Fail" at block decision 704). For example, the controller 120 checks the defective string information 164 in response to determining that one or more strings of the block 107A failed the string defect leakage check and updates the defective string information 164 to indicate that the one or more strings of the block 107A failed the string defect leakage check. In some examples, the defective string information 164 includes a lookup table that stores defective string information for the blocks 107A-107N.

The second example process 700 includes disabling any newly defective strings of the block during a second programming operation of the block (at block 708). For example, the controller 120, during the next programming operation of the block, retrieves the defective string information 164 and disables the one or more strings of the block 107A that failed the string defect leakage check. In some examples, the controller 120 disables the defective strings of the block 107A by retrieving the string information of the block 107A from a lookup table in the defective string information 164, during the programming operation of the block 107A, and removes the one or more strings of the block 107A from the available memory regions 122 based on the string information of the block 107A that is retrieved from the lookup table.

The second example process 700 includes performing regular operation on the block (at block 710) in response to determining that all strings of the block did not fail the string defect leakage check ("Pass" at decision block 704). For example, the controller 120 performs regular operations on the block 107A in response to determining that all strings of the block 107A did not fail the string defect leakage check.

The second example process 700 recovers the block 107A because the defective strings are disabled, which leaves the block 107A available for partial use. The second example process 700 is advantageous over the first example process 600 because the total number of strings available in the memory 104 will greater with the second example process 700 than the first example process 600. For example, the first example process 600 may retire ten blocks, which add up to three-hundred and forty megabytes of memory space that is removed from the available memory regions 122. However, the second example process 700 does not retire the ten blocks, but rather, disables the defective neighboring pairs of strings, which may result in significantly less than the three-hundred and forty megabytes of memory space being removed from the available memory regions 122. The advance of the second example process 700 over the first example process 600 becomes more pronounced with any additional increases in block size.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed devices, methods, and apparatuses will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A memory controller comprising:
   a memory interface configured to interface with a memory having a plurality of wordlines, each wordline having a plurality of strings; and
   a controller circuit configured to:
      perform a string defect leakage check on one wordline of the plurality of wordlines during a first programming operation of the one wordline,
      determine whether the one wordline has one or more string to string shorts based on the string defect leakage check, and
      resolve the one or more string to string shorts in response to determining that the one wordline has the one or more string to string shorts.

2. The memory controller of claim 1, wherein, to resolve the one or more string to string shorts, the controller circuit is further configured to retire the one wordline from programming operations.

3. The memory controller of claim 2, further comprising a second memory that includes an available memory regions data structure,
   wherein, to retire the one wordline from the programming operations, the controller circuit is further configured to remove the one wordline from the available memory regions data structure.

4. The memory controller of claim 1, wherein, to resolve the one or more string to string shorts, the controller circuit is further configured to:
   update defective string information of the one wordline, and
   disable defective strings of the one wordline during a second programming operation of the one wordline.

5. The memory controller of claim 4, further comprising:
   a second memory that stores the defective string information in a lookup table, wherein, to update the defective string information of the one wordline, the controller circuit is further configured to update string information of the one wordline in the lookup table to include information of one or more strings in the one wordline that have the one or more string to string shorts.

6. The memory controller of claim 5, wherein the second memory includes an available memory regions data structure,
wherein, to disable the defective strings of the one wordline during the programming operation of the one wordline, the controller circuit is further configured to:
retrieve the string information of the one wordline from the lookup table during the programming operation of the one wordline, and
remove one or more strings of the one wordline from the available memory regions data structure based on the string information of the one wordline that is retrieved from the lookup table.

7. The memory controller of claim 1, wherein, to perform the string defect leakage check, the controller circuit is further configured to:
apply a high bias to different neighboring string pairs in the one wordline and a low bias to all other strings in the one wordline, and
detect a leakage current in the different neighboring string pairs while applying the high bias to the different neighboring string pairs,
wherein a detection of the leakage current in one or more of the different neighboring string pairs while applying the high bias to the different neighboring string pairs is indicative of a string to string short in the one or more of the different neighboring string pairs.

8. The memory controller of claim 1, wherein, to perform the string defect leakage check, the controller circuit is further configured to:
apply a first high bias to even strings and a first low bias to odd strings,
detect a first leakage current in any of the even strings while applying the first high bias to the even strings,
apply a second high bias to the odd strings and a second low bias to the even strings, and
detect a second leakage current in any of the odd strings while applying the second high bias to the odd strings,
wherein a detection of the first leakage current in one of the even strings while applying the first high bias to the even strings is indicative of a string to string short in the one of the even strings, and
wherein a detection of the second leakage current in one of the odd strings while applying the second high bias to the odd strings is indicative of a string to string short in the one of the odd strings.

9. A method, comprising:
performing, with a controller circuit, a string defect leakage check on one wordline of a memory during a first programming operation of the one wordline;
determining, with the controller circuit, whether the one wordline has one or more string to string shorts based on the string defect leakage check; and
resolving, with the controller circuit, the one or more string to string shorts in response to determining that the one wordline has the one or more string to string shorts.

10. The method of claim 9, wherein resolving the one or more string to string shorts further includes retiring the one wordline from programming operations.

11. The method of claim 10, wherein retiring the one wordline from the programming operations further includes removing the one wordline from an available memory regions data structure.

12. The method of claim 9, wherein resolving the one or more string to string shorts further includes:
updating defective string information of the one wordline, and
disabling defective strings of the one wordline during a second programming operation of the one wordline.

13. The method of claim 12, wherein updating the defective string information of the one wordline further includes updating string information of the one wordline in a lookup table to include information of one or more strings in the one wordline that have the one or more string to string shorts.

14. The method of claim 13, wherein disabling the defective strings of the one wordline during the programming operation of the one wordline further includes:
retrieving the string information of the one wordline from the lookup table during the programming operation of the one wordline, and
removing one or more strings of the one wordline from an available memory regions data structure based on the string information of the one wordline that is retrieved from the lookup table.

15. The method of claim 9, wherein performing the string defect leakage check further includes:
applying a high bias to different neighboring string pairs in the one wordline and a low bias to all other strings in the one wordline, and
detecting a leakage current in the different neighboring string pairs while applying the high bias to the different neighboring string pairs,
wherein a detection of the leakage current in one or more of the different neighboring string pairs while applying the high bias to the different neighboring string pairs is indicative of a string to string short in the one or more of the different neighboring string pairs.

16. The method of claim 9, wherein performing the string defect leakage check further includes:
applying a first high bias to even strings and a first low bias to odd strings,
detecting a first leakage current in any of the even strings while applying the first high bias to the even strings,
applying a second high bias to the odd strings and a second low bias to the even strings, and
detecting a second leakage current in any of the odd strings while applying the second high bias to the odd strings,
wherein a detection of the first leakage current in one of the even strings while applying the first high bias to the even strings is indicative of a string to string short in the one of the even strings, and
wherein a detection of the second leakage current in one of the odd strings while applying the second high bias to the odd strings is indicative of a string to string short in the one of the odd strings.

17. An apparatus comprising:
means for performing a string defect leakage check on one wordline during a first programming operation of the one wordline;
means for determining whether the one wordline has one or more string to string shorts based on the string defect leakage check; and
means for resolving the one or more string to string shorts in response to determining that the one wordline has the one or more string to string shorts.

18. The apparatus of claim 17, wherein the means for resolving the one or more string to string shorts further includes means for retiring the one wordline from programming operations.

19. The apparatus of claim 17, wherein the means for resolving the one or more string to string shorts further includes:
- means for updating defective string information of the one wordline, and
- means for disabling defective strings of the one wordline during a second programming operation of the one wordline.

20. The apparatus of claim 19, wherein the means for updating defective string information of the one wordline further includes means for updating string information of the one wordline in a lookup table to include information of one or more strings in the one wordline that have the one or more string to string shorts.

* * * * *